United States Patent
Matsuyama et al.

(10) Patent No.: US 9,041,412 B2
(45) Date of Patent: May 26, 2015

(54) METHODS OF TESTING A CONNECTION BETWEEN SPEAKERS AND A POWER AMPLIFIER AND DEVICES THEREFOR

(75) Inventors: Minoru Matsuyama, Fukushima (JP); Taro Kitagawa, Fukushima (JP)

(73) Assignee: Alpine Electronics, Inc., Tokyo (JP)

( * ) Notice: Subject to any disclaimer, the term of this patent is extended or adjusted under 35 U.S.C. 154(b) by 486 days.

(21) Appl. No.: 13/431,417

(22) Filed: Mar. 27, 2012

(65) Prior Publication Data

US 2012/0286798 A1 Nov. 15, 2012

(30) Foreign Application Priority Data

May 9, 2011 (JP) ................................ 2011-103926

(51) Int. Cl.
*G01R 31/04* (2006.01)
*G01R 31/02* (2006.01)

(52) U.S. Cl.
CPC .................................. *G01R 31/025* (2013.01)

(58) Field of Classification Search
CPC .............................. G01R 31/025; G01R 31/02
USPC ............................ 324/538–544, 537, 750.01, 324/755.01–758.01; 330/9, 51; 327/365; 307/112–116
See application file for complete search history.

(56) References Cited

U.S. PATENT DOCUMENTS

| | | | |
|---|---|---|---|
| 5,450,624 A * | 9/1995 | Porambo et al. | 455/226.4 |
| 5,815,584 A * | 9/1998 | Whitecar et al. | 381/86 |
| 7,362,180 B2 | 4/2008 | Noro et al. | |
| 7,847,632 B2 | 12/2010 | Ikejiri | |
| 8,093,951 B1 * | 1/2012 | Zhang et al. | 330/251 |

FOREIGN PATENT DOCUMENTS

| | | |
|---|---|---|
| JP | 2000-244256 | 9/2000 |
| JP | 2007-074119 | 3/2007 |

* cited by examiner

*Primary Examiner* — Melissa Koval
*Assistant Examiner* — Trung Nguyen
(74) *Attorney, Agent, or Firm* — Brinks Gilson & Lione

(57) ABSTRACT

The present disclosure provides methods and devices for testing a connection between speakers and a power amplifier. The disclosed methods and devices solve a problem that, upon a connection test for a power amplifier which has a booster power source, when a midpoint potential of the power amplifier and the voltage of the speaker connection terminal are compared, and it is determined that short-circuiting occurs on a ground side when the potential of the speaker connection terminal is lower than the midpoint potential, a wrong test is conducted if a midpoint potential is higher than a battery voltage.

12 Claims, 5 Drawing Sheets

1. DETECT SHORT-CIRCUITING ON BATTERY VOLTAGE SIDE WHEN VOLTAGE HIGHER THAN 6 V UPON CONNECTION TEST IS DETECTED

2. DETECT SHORT-CIRCUITING ON GROUND SIDE WHEN VOLTAGE LOWER THAN 6 V UPON CONNECTION TEST IS DETECTED

METHODS OF TESTING A CONNECTION BETWEEN SPEAKERS AND A POWER AMPLIFIER AND DEVICES THEREFOR

RELATED APPLICATIONS

The present application claims priority to Japanese Patent Application Serial Number 2011-103926, filed May 9, 2011, the entirety of which is hereby incorporated by reference.

BACKGROUND OF THE INVENTION

1. Field of the Invention

The present invention relates to methods for testing a connection between speakers and a power amplifier which detect whether or not speakers are appropriately connected to the power amplifier for an audio device mounted on a car, and devices which implement these methods.

2. Description of the Related Art

Car audio devices are installed in almost all cars and are indispensable to the comfort of car users. Audio devices may be installed in a car on a production line during assembly of the car, or a user may purchase their favorite audio devices and ask car dealers and car-related equipment distributors to install the audio devices.

With such a car audio device, speakers are fixed at positions which provide a good acoustic effect in a car and which do not disturb the user in the car. The speakers are connected to a head unit that is attached to, for example, a front panel of a car for use. In many cases, this head unit has a radio receiving function and, in addition, has built-in devices such as a CD player, a television receiver and a DVD player, and further has a navigation function and, in some cases, is connected with a disk exchanger for utilizing CDs or DVDs.

This head unit amplifies the sound volume by means of an amplifier to output audio sounds of these devices or sounds (hereinafter abbreviated as "sounds") from speakers with an adequate sound volume. In this case, the sound is outputted from the speakers having the positions and sound quality adjusted to provide a good acoustic effect as much as possible in a car or exhibit an acoustic effect of, for example, the 4.1 surround.

Hence, the head unit has a power amplifier to output the sound with the speakers at a sound volume that the user desires. The speakers are provided at various positions in a car and may be connected to the amplifier, where each speaker is connected to the amplifier with a connection cord connected to a connection terminal in the amplifier. By this means, the sound amplified by the amplifier with an adequate balance per speaker is outputted with a predetermined sound quality, with the sound volume the user desires as a whole in a car and with an adequate balance of the sound volume per speaker.

In such a car audio device, appropriately connecting a power amplifier and car speakers is important. To appropriately connect a power amplifier and car spearks, each speaker needs to be appropriately connected with respective connection terminals set in advance with connection cords. Additionally, while connecting the car speakers it is important to avoid directly contacting a conductive material in the car or contacting a power source system such as a battery, causing a short-circuit.

Hence, a product line for cars on which audio devices are installed generally includes a testing procedure of checking whether or not the audio devices are appropriately connected within the cars after the devices are installed in the cars. Further, even when a user additionally purchases a favorite audio device and asks a car dealer or a car-related device distributor to attach this audio device as described above, a worker needs to finally test whether or not the audio device is appropriately attached. Furthermore, even when a wiring system of speakers is repaired after the wiring system is damaged due to, for example, an accident during use of a car, it is necessary to test connections between a power amplifier and the speakers.

Various methods have been conventionally used to test connections between speakers and a power amplifier. A conventional example 1 is illustrated in FIG. 4(a). In this example, a mode of a speaker connection test with respect to a power amplifier illustrated in FIG. 4(a) shows a mode of a speaker connection test with respect to a power amplifier which amplifies an audio signal using a battery voltage of a car, as illustrated in FIG. 4(a-1), and presents an amplified waveform as illustrated in FIG. 4(a-2).

As illustrated in FIG. 4(a-2), when an audio signal is amplified using the battery voltage, a waveform having 6 V of a midpoint potential in the center with respect to a battery voltage of 12 V, which a car provides, is formed with respect to this battery voltage. In addition, an actual waveform in this case is formed as illustrated as a whole in a digital amplifier according to a digital signal in many cases.

With a mode of testing short-circuiting upon testing of the power amplifier in FIG. 4(a-2), the power amplifier which operates as described above measures the potential which is provided during the operation of this power amplifier, at a portion of a speaker connection terminal. The power amplifier determines that short-circuiting occurs on the battery potential side when a voltage higher than 6 V of the midpoint potential is detected and determines that short-circuiting occurs on a ground potential side when a voltage lower than the midpoint potential is detected.

In addition, although, upon this determination, it is theoreticaly possible to determine whether or not short-circuiting occurs by detecting whether or not, for example, the potential is 12 V or 0 V, the battery potential does not maintain 12 V at all times. Various decreases in the voltage may occur and there are cases where the ground potential is not 0 V at all times, and therefore on which side short-circuiting occurs is determined by determining whether the potential is greater or smaller than the midpoint potential as described above.

By contrast with this, a car audio device plays back music while a car is running in an environment of loud noise caused by sources such as an engine sound of a car, a driving sound, wind noise or the sound of cars running side by side. Hence, the car audio device requires a larger sound volume than a household audio device, and the car audio device may have difficulty in meeting a user's demand to output sounds at a high volume with adequate sound quality utilizing 12 V of voltage from a battery installed in a common passenger car. Therefore, the audio device mounted on a car boosts 12 V of battery power source to, for example, 30 V or 40 V to obtain desired power to operate the power amplifier.

Japanese Patent Application Laid-Open No. 2007-74119 discloses a technique of invalidating a detection result of a current detecting unit by means of a voltage detecting unit when a large current flows in speakers and preventing error detection of short-circuiting by detecting that a power source current exceeds an upper limit current value and outputting a detection signal at a high level. The technique includes forcibly switching the detection signal to a low level when detecting that the output voltage exceeds the upper limit voltage value, and enabling both of accurate detection and prevention of error detection of short-circuiting in an amplifier by validating a detection result of the current detecting unit by means of the voltage detection unit upon actual short-circuiting and outputting the detection signal at a high level.

Japanese Patent Application Laid-Open No. 2010-34775 discloses a technique of accurately detecting output short-circuiting in an amplifier with a simple circuit configuration. In the technique two comparison pulse signals are generated based on each signal level of two output stage input pulse signals generated based on an input pulse signal and inputted to an output stage of the amplifier, and a predetermined generation threshold, and outputting a short-circuiting detection signal according to a level comparison result obtained by comparing the signal level of an output pulse from this amplifier and a predetermined detection threshold.

Furthermore, Japanese Patent Application Laid-Open No. 2000-244256 discloses a technique of controlling the bias of a bias circuit to rapidly rise by detecting ground fault or supply fault in a voltage detection circuit based on a midpoint voltage of two output transistors when a power source is activated in a state of ground fault or supply fault. Destruction of the output transistors is prevented due to supply fault or ground fault upon activation of the power source by quickly placing a driving stage transistor and a ground fault/supply fault detection circuit in steady states.

Still further, Japanese Patent Application Laid-Open No. 2006-60278 discloses a technique of reliably detecting short-circuiting of speaker outputs and preventing destruction of an amplifier due to power source pumping. The technique includes providing a direct current voltage detection circuit which detects a direct current voltage produced in speaker output terminals, a control circuit which performs a protection operation when the direct current voltage detection circuit outputs a detection signal and a midpoint potential detection circuit which detects a difference between the midpoint potentials of a positive power source voltage +V and a negative power source voltage −V, connecting the output of the midpoint potential detection circuit to the input of the direct current voltage detection circuit and having the direction current voltage detection circuit output the detection signal when the difference between the midpoint potentials is detected.

The power amplifier having the above booster power source uses a battery power source, which is illustrated in FIG. 4(b-1) for example, and is the same as in FIG. 4(a-1), and uses a booster power source which boosts the battery power source to 40 V, as illustrated in FIG. 4(b-2), to amplify and output the waveform illustrated in FIG. 4(a) as a waveform having 20 V of a midpoint potential as illustrated in FIG. 4(b-3).

When a power amplifier having this performance is used, a device having functional blocks as illustrated in, for example, FIG. 5 to conduct the above connection test of speakers is utilized. With a conventional example of a speaker connection test with respect to a power amplifier using a booster power source illustrated in FIG. 5, when a 12 V battery 32 mounted on a car supplies power to a power amplifier 31, a booster power source 33 boosts the power to 40 V with the illustrated example. A power amplifier IC 34 amplifies an audio signal as illustrated in FIG. 4(b-3) to have 20 V of a midpoint potential, and outputs the audio signal from a speaker connection terminal 35 of the power amplifier 31 to a speaker 36 through a wiring connected with the speaker connection terminal 35.

The above speaker connection test with respect to the power amplifier 31 is conducted by a testing device having an additional speaker connection test processing unit or a speaker connection test processing unit built in advance in a power amplifier. The example illustrated in FIG. 5 shows an example where a speaker connection test processing unit 37 provided in advance in the power amplifier 31 conducts the above speaker connection test.

With the example of a speaker connection test processing unit 41, illustrated in FIG. 5, in a state where the power amplifier is powered on, a test signal is adequately inputted and a midpoint potential of the power amplifier IC 34 is acquired according to a command of a midpoint potential acquiring unit 43 from a bidirectional communication unit 42 of a speaker connection test processing unit 41.

A connection test determining unit 45 of the speaker connection test processing unit 41 detects the voltage at the portion of the connection terminal 35 in the power amplifier IC 34 through the bidirectional communication unit 42, and conducts, if necessary, various connection tests as to whether or not speakers are connected, whether the connected speakers short-circuit on a battery power source side or on a ground potential side, whether or not speakers which need to be originally connected are connected, and whether or not there is a wiring mistake in the power amplifier.

In relation to the present disclosure, an illustrated example of the connection test determining unit 45 shows an example where a battery side short-circuiting 46 determining unit determines whether or not short-circuiting occurs on the battery power source side and a ground side short-circuiting 47 determining unit determines whether or not short-circuiting occurs on the ground side. The battery side short-circuiting 46 detection unit outputs the test results from a test result outputting unit 44 to, for example, a display unit.

This connection test determining unit 45 conducts a test according to a mode of a short-circuiting test as illustrated in FIG. 4(b-3) in a mode of a speaker connection test with respect to a power amplifier having the 40 V booster power source illustrated in FIG. 4(b). That is, similar to a mode of a short-circuiting test in FIG. 4(a-2) in the speaker connection test of the power amplifier without the booster power source in FIG. 4(a), whether or not the midpoint potential short-circuits on the battery power side or short-circuits on the ground side is determined.

That is, the connection test determining unit 45 in the speaker connection test processing unit 41 in FIG. 5 performs processing of pulling in the midpoint potential of a signal which is acquired in the midpoint potential acquiring unit 43 and which is currently outputted from the power amplifier, detecting the voltage at the portion of the output terminal of the power amplifier IC 34 and determining whether the midpoint potential short-circuits on the battery potential side or ground side based on whether the portion includes the battery potential or ground potential.

Hence, as illustrated in FIG. 4(b-3), even though 20 V of a midpoint potential needs to be detected when short-circuiting occurs on the ground side, a potential lower than the midpoint potential is detected and therefore it is naturally determined that short-circuiting occurs on the ground side, and, also in cases where short-circuiting occurs on the battery side, a voltage lower than 20 V of the midpoint potential is detected, and therefore it is determined that short-circuiting occurs on the ground side. This is as described in the lower part of FIG. 4 as the problem of the conventional techniques.

SUMMARY OF THE INVENTION

It is therefore an object of the present invention to solve the problem that, upon a connection test of the power amplifier having a booster power source, processing is performed of comparing the midpoint potential of a power amplifier and the voltage of a speaker connection terminal, and determining at all times that short-circuiting occurs on the ground side when the voltage of the speaker connection terminal is lower than the midpoint potential, and therefore a wrong test is conducted.

In one aspect, a method of testing a connection between a speaker and a power amplifier is disclosed. In the method, the power amplifier has a booster power source which boosts a battery voltage, a power amplifier integrated circuit ("IC") which operates at a voltage boosted by the booster power source, and a connection terminal which connects the power amplifier IC with the speaker, and which determines that short-circuiting occurs on a ground side when a voltage of the connection terminal is lower upon comparison of a midpoint potential of an operation voltage of the power amplifier IC and a terminal voltage of the connection terminal. The method includes: switching a voltage for a power amplifier IC from a booster power source to a battery voltage when a connection test of the speaker is conducted and performing the determination using a midpoint potential of a battery voltage as the midpoint potential.

Further, with another method of testing a connection between the speaker and the power amplifier, the method may include a speaker connection test processing unit in the power amplifier conducting a speaker connection test with respect to the power amplifier.

Furthermore, with another method of testing a connection between the speaker and the power amplifier, the method may include a speaker connection testing device which is separate from the power amplifier conducting a speaker connection test with respect to the power amplifier.

Still further, with another method of testing a connection between the speaker and the power amplifier, when a speaker connection test with respect to the power amplifier is finished, a voltage for a power amplifier IC is switched from a battery voltage to a booster power source side.

Moreover, with another method of testing a connection between the speaker and the power amplifier, the power amplifier may include a plurality of power amplifier ICs that match a plurality of speakers in number, and, upon the speaker connection test, the power amplifier ICs are sequentially selected and tested.

Further, with another method of testing a connection between the speaker and the power amplifier, a result of the speaker connection test with respect to the power amplifier is stored and, when a test result is outputted, the stored test result is read and outputted.

In another aspect, a speaker connection testing device is disclosed. The speaker connection testing device is for a power amplifier which has a booster power source which boosts a battery voltage, a power amplifier IC which operates at a voltage boosted by the booster power source, and a connection terminal which connects the power amplifier IC with the speaker. The power amplifier further has a speaker connection test processing unit which determines that short-circuiting occurs on a ground side when a voltage of the connection terminal is lower upon comparison of a midpoint potential of an operation voltage of the power amplifier IC and a terminal voltage of the connection terminal. in the booster power source, the power amplifier further includes a battery voltage pull-in unit is configured to pull in a battery voltage and is positioned in parallel to a boosting unit which boosts a battery voltage. The power amplifier further includes a switching unit configured to switch a supply voltage from a booster power source to a power amplifier IC, to the booster unit or a battery voltage pull-in unit, and in the speaker connection test processing unit, when the speaker connect test is performed, configured to switch voltage to the power amplifier IP to the battery voltage. The determination is performed using the midpoint potential of the battery voltage as the midpoint potential.

Further, with another speaker connection testing device for the power amplifier, in the speaker connection testing device for the power amplifier, the speaker connection test processing unit is provided in a power amplifier.

Moreover, with another speaker connection testing device for the power amplifier, in the speaker connection testing device for the power amplifier, the speaker connection test processing unit is provided in a speaker connection testing device which is separate from a power amplifier.

Further, with another speaker connection testing device for the power amplifier, in the speaker connection testing device for the power amplifier, when a speaker connection test with respect to the power amplifier is finished, the switching unit switches a voltage for a power amplifier IC, from a battery voltage to a booster power source side.

Further, with another speaker connection testing device for the power amplifier, in the speaker connection testing device for the power amplifier, a plurality of power amplifier ICs matching a plurality of speakers in number are provided, and a test channel specifying unit provided in the speaker connection test processing unit sequentially selects a power amplifier IC to conduct a speaker connection test.

Furthermore, with another speaker connection testing device for the power amplifier, the speaker connection testing device for the power amplifier further has in the speaker connection test processing unit, a test result storage unit which stores a test result, and a test result outputting unit which outputs a test result stored in the test result storage unit.

Implementations of the present invention are configured as described, so that it is possible to solve a problem that, upon a connection test for a power amplifier which has a booster power source, when processing is performed of comparing a midpoint potential of the power amplifier and the voltage of the speaker connection terminal, and determining that short-circuiting occurs on a ground side when the potential of the speaker connection terminal is lower than the midpoint potential, it is determined that, if a midpoint potential of the booster power source is higher than a battery voltage, short-circuiting occurs on the ground side even though short-circuiting occurs on the battery power source side.

DETAILED DESCRIPTION OF THE DRAWINGS

Figure 1:
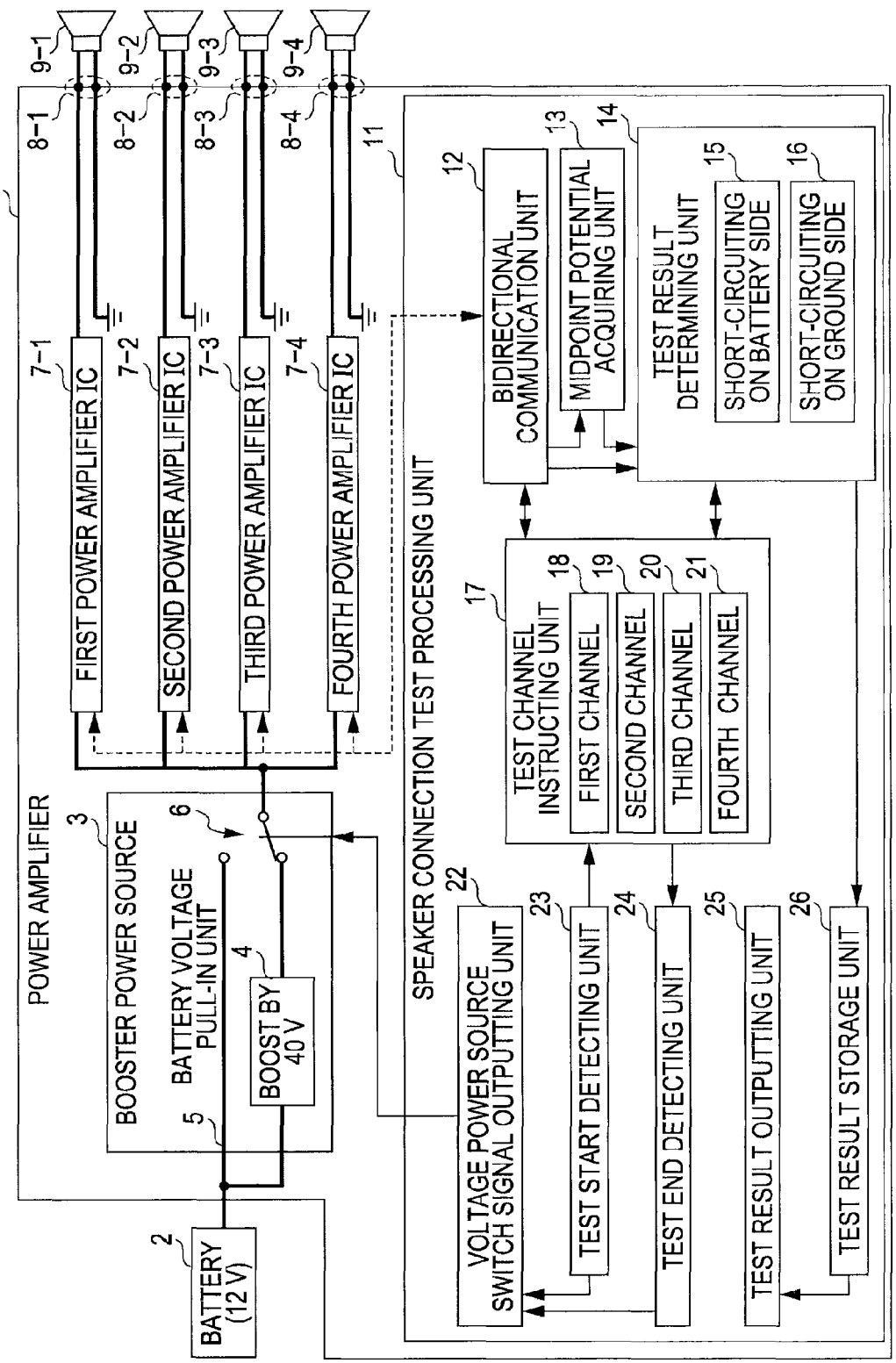
FIG. 1 is a functional block diagram of one implementation of a system for testing a connection between speakers and a power amplifier.

Methods and systems for testing a connection between speakers and a power amplifier will be described in conjunction with the accompanying drawings. FIG. 1 is a functional block diagram according to the example of one implementation of a system for testing a connection between speakers and a power amplifier. In addition, in this figure and the other figures, functional units that perform each function may be regarded as means that respectively performs each function.

FIG. 1 illustrates an example of a power amplifier having a speaker system of four channels. The functional block diagram illustrated in FIG. 1 illustrates some functional blocks which perform the same function, in the same manner, as the conventional example illustrated in FIG. 5. With the example illustrated in FIG. 1, a power amplifier 1 is supplied with power from a 12 V battery 2 of a car, and has a booster power source 3 having a 40 V boosting unit 4 with the illustrated example.

In some implementations, this booster power source 3 has a battery voltage pull-in unit 5 in parallel to the 40 V booster unit 4, and a switch 6 which switches the voltage supplied from the booster power source 3 to a power amplifier IC, to the voltage of the booster power source from the 40V booster unit 4 or the voltage of the battery voltage pull-in unit 5 which does not pass this 40 V booster unit 4. The switch 6 switches the voltage according to a signal from a booster power source switch signal outputting unit 22 of a speaker connection test processing unit 11 described below. In addition, this switch can be formed in various forms using an electronic circuit.

FIG. 1 illustrates an example where four speakers are provided, four channels are provided to output unique sounds, a first power amplifier IC7-1, a second power amplifier IC7-2, a third power amplifier IC7-3 and a fourth power amplifier IC7-4 are provided, and speakers 9-1, 9-2, 9-3 and 9-4 are connected by respective wirings through connection portions 8-1, 8-2, 8-3 and 8-4.

Figure 5:
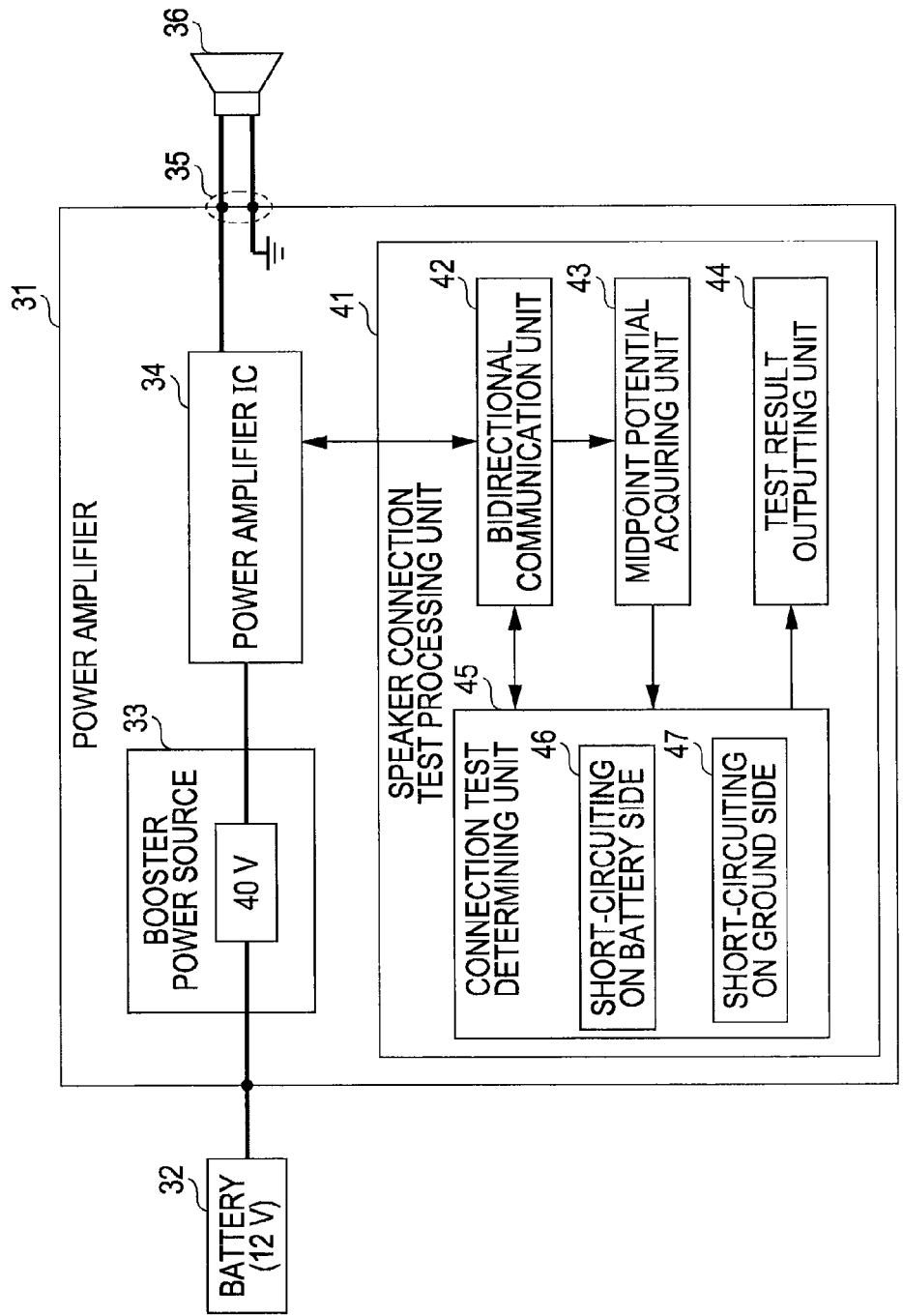
FIG. 5 is a functional block diagram according to a conventional example.

The speaker connection test processing unit 11 has a bidirectional communication unit 12 similar to the conventional example illustrated in FIG. 5, and selectively communicates with each of the first to fourth power amplifiers IC7-1 to 7-4. A midpoint potential acquiring unit 13 also acquires the midpoint potential which operates each power amplifier IC similar to the conventional example in FIG. 5, and, with the example of FIG. 1, the switch 6 switches in the booster power source 3 between a 12 V battery potential and a 40 V booster power source, and therefore the midpoint potential to be pulled in is 6 V upon the 12 V battery potential and 20 V when the voltage is switched to the 40 V boosting unit.

Meanwhile, when the speaker connection test processing unit 11 operates as described below, a test start detecting unit 23 detects a command from a person who conducts this test, and the switch 6 of the booster power source 3 switches to the battery voltage pull-in unit 5 side according to a signal from the booster power source switch signal outputting unit 22 to pull in only a midpoint potential of 6V.

Although the connection test determining unit 14 determines a battery side short-circuiting 15 or a ground side short-circuiting 16 according to the same method as the conventional example in FIG. 5, the four power amplifiers IC are provided with the example illustrated in FIG. 1 to sequentially perform the same connection determination processing for channels specified in a test channel instructing unit 17.

Therefore, the connection test determining unit 14 performs processing of comparing, for the channels sequentially specified in the test channel instructing unit 17, 6 V which is the midpoint potential of the above battery voltage acquired in the midpoint potential acquiring unit 13 and the potential which is pulled in by the bidirectional communication unit 12, at the portion of the connection terminal of the specified channel.

In this case, similar to the mode of the short-circuiting test in FIG. 4(a-2) according to the first conventional example in FIG. 4(a) and as illustrated as an operation upon a speaker connection test with a power amplifier in FIG. 3(b) described below, short-circuiting on the battery side is detected when the potential is higher than 6 V of the midpoint potential, and short-circuiting on the ground side is detected when the potential is lower than this midpoint potential. With the illustrated example, this determination result is stored in a test result storage unit 26 per channel as described below.

In addition, although it is theoretically possible to determine whether or not short-circuiting occurs by detecting whether the potential is, for example, 12 V or 0 V, the battery potential may not maintain 12 V at all times due to a decrease in the voltage, and the ground potential may not be 0 V at all times. Therefore on which side short-circuiting occurs may be determined by determining whether the potential is greater than or smaller than the midpoint potential.

To conduct a speaker connection test with respect to the power amplifier IC of each channel in the speaker system of four channels as illustrated, the test channel instructing unit 17 selects, for example, the first channel 18 first according to the signal from the test start detecting unit 23 which receives an input of a command from a person who conducts a test. The bidirectional communication unit 12 commands the first power amplifier IC7-1 to output the voltage of the connection terminal, and then, the first power amplifier IC7-1 outputs a voltage detection signal.

This voltage detection signal is pulled in from the bidirectional communication unit 12. The connection test determining unit 14 compares the voltage of the voltage detection signal with the midpoint potential separately pulled in the midpoint potential acquiring unit 13 to perform a determination as described and to store the determination result in the test result storage unit 26. When this processing is finished, the test channel instructing unit 17 selects the second channel 19 and performs the same processing, and then sequentially selects the third channel 20 and the fourth channel 21 and stores the test results in the test result storage unit 26 per channel particularly when detecting a connection abnormality.

When the test start detecting unit 23 detects that a person who conducts a test inputs a test start signal, the booster power source switch signal outputting unit 22 of the speaker connection test processing unit 11 outputs a specifying signal for switching the switch to the battery voltage pull-in unit 5 side, to the switch 6 of the booster power source 3. By this means, upon a connection test of the power amplifier, the 12 V battery voltage is supplied to each power amplifier IC.

Subsequently, when the person who conducts a test inputs a test end specifying signal, or the test channel instructing unit 17 specifies all channels and detects that a test is finished, a test end detecting unit 24 automatically detects that the test is finished. The test channel instructing unit 17 then outputs a test end signal to the booster power source switch signal outputting unit 22. In this case, the booster power source switch signal outputting unit 22 gives a command of switching the switch 6 of the booster power source 3 to the 40 V boosting unit 4 side. By this means, when a connection test with respect to the power amplifier is finished, the 40 V booster power source for a normal operation can be utilized for each power amplifier IC.

The test result outputting unit 25 reads the determination result from the test result storage unit 26 which stores the determination results from the connection test determining unit 14 per channel as described above according to, for example, an operator's command, and outputs the test result to a monitor to display. The operator can learn that there is no abnormality in particular or can learn the mode of short-circuiting in a specific channel, based on this display, corrects, for example, connection of the speakers and confirms whether or not the speakers are appropriately re-connected.

Figure 2:
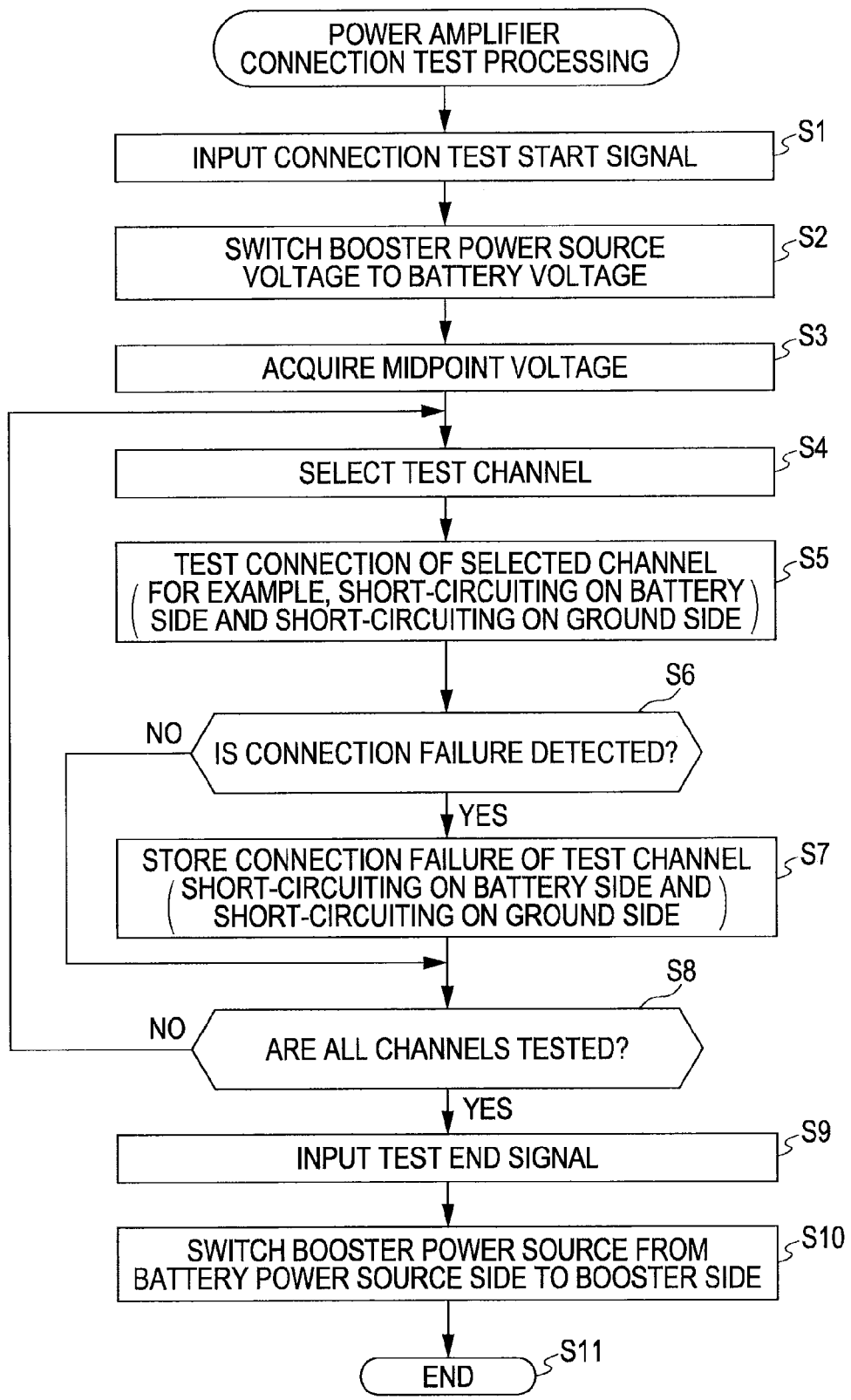
FIG. 2 is one implementation of an operation flowchart of a method for testing a connection between speakers and a power amplifier.

In implementations that include the functional blocks as described above, it is possible to operate and execute an operation flow illustrated in, for example, FIG. 2 in order. That is, with the example of power amplifier connection test processing illustrated in FIG. 2, a connection test start signal is first inputted (step S1). This test start signal is received as input by the test start detecting unit 23 in the speaker test processing unit 11 in FIG. 1.

Then, the booster power source voltage is switched to the battery voltage (step S2). This operation is performed by outputting a signal for switching the switch 6 to the battery voltage pull-in unit 5 side, to the switch 6 of the booster power 3 when the booster power source switch signal outputting unit 22 of the speaker connection test processing unit 11 receives an input of the signal from the test start signal detecting unit 23 as described above.

Next, the test channel is selected (step S4). This processing is performed by specifying, for example, the first channel when the test channel instructing unit 17 of the speaker connection test processing unit 11 in FIG. 1 detects the test start signal of the test start signal detecting unit 23. Although the channel specified in this case is by no means limited to the first channel, and an arbitrary channel can be specified, channels are subsequently specified by selecting a channel which is not yet selected to test.

Then, a connection test of the selected channel is conducted (step S5). Although this processing is performed in the connection test determining unit 14 of the speaker connection test processing unit 11 in FIG. 1, this determination processing has been described in details in conjunction with FIG. 1 and therefore will not be described in details. Upon this test, the midpoint potential of the 12 V battery voltage is acquired in step S3 of acquiring the midpoint potential, so that it is possible to test short-circuiting based on whether or not the detected voltage is higher or lower than 6 V of the midpoint potential, and solve the problem of the conventional technique.

Upon a connection test in this case, it is possible to conduct, if necessary, various conventional tests as to whether short-circuiting occurs on the battery potential side as described above or on the ground side, and, in addition, conduct a test as to whether speaker connection cords short-circuit or speakers having performance supporting a signal amplified by each power amplifier IC are connected, and further conduct conventionally proposed various connection tests.

Then, whether or not connection failure is detected is determined with the example illustrated in FIG. 2 (step S6), and the method proceeds to step S7 when connection failure is detected to store this connection failure of a test channel. This operation is performed by storing the determination result of the connection test determining unit 14, in the test result storage unit 26 in FIG. 1.

If connection failure is not detected thereafter or in above step S6, the method proceeds to step S8 to determine whether or not all channels are tested. As a result of the determination, when it is determined that there are channels which are not yet tested, the method returns to step S4 to select a test channel which is not yet tested and repeat the operation thereafter.

In step S8, when it is determined that all channels are tested, the method proceeds to step S9 to receive an input of a test end signal from a user, switch the booster power source voltage according to the inputted signal from the battery voltage side switched in step S2 as described above to the booster power source side and finish a series of processings (step S10).

These operations are performed by outputting the above switch signal to the switch 6 of the booster power source 3, from the booster power source switch signal outputting unit 22 when the test end detecting unit 24 in FIG. 1 detects that the test is finished as described above. By this means, each power amplifier IC can subsequently provide a high output of a sound using the 40 V booster power source.

Figure 3A:
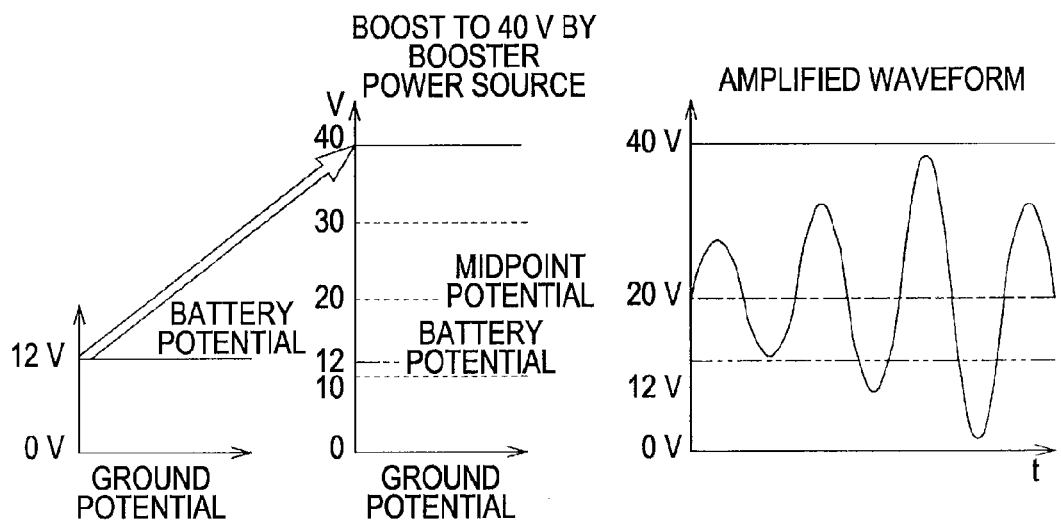
FIG. 3 is a view illustrating one implementation of an operation mode.
Figure 3B:
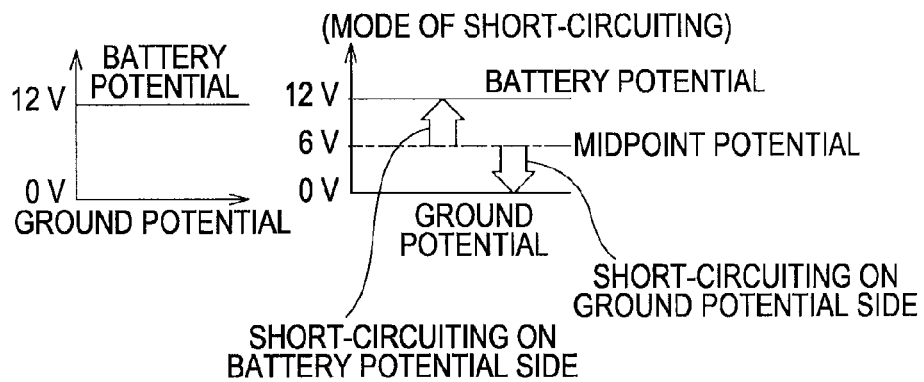
Figure 4A:
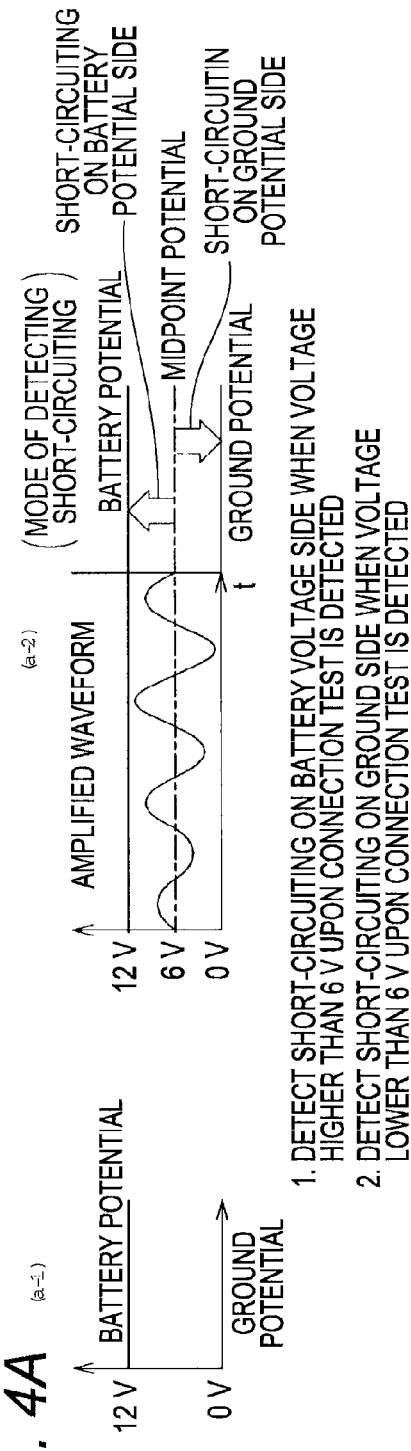
FIG. 4 is a view illustrating one implementation of an operation mode according to a conventional example and a common problem.
Figure 4B:
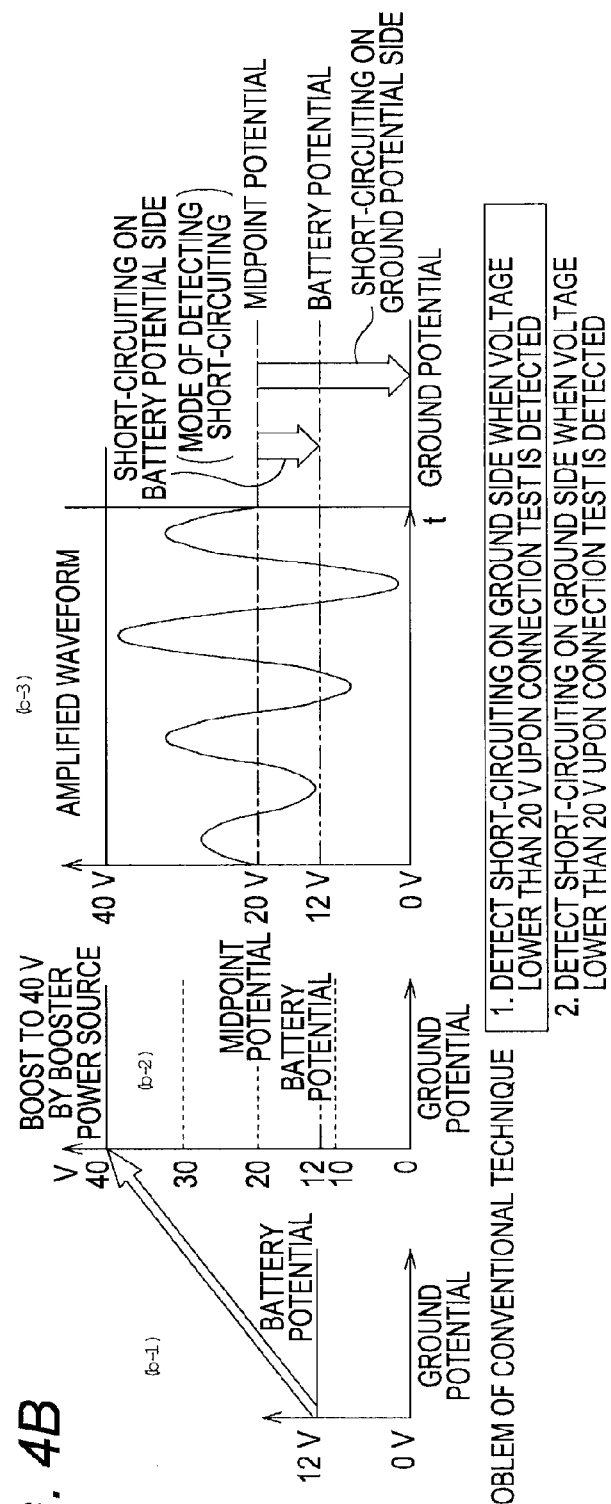

In the described implementations, the above operation is performed to boost the 12 V battery voltage to 40 V upon a normal power amplifier operation; deactivate the booster power source as illustrated in FIG. 3(b) in the power amplifier which can provide a high output of the sound as illustrated in FIG. 3(a) upon a speaker connection test with respect to this power amplifier; and sets the midpoint potential of the booster power source to the midpoint potential of the battery potential, so that it is possible to reliably detect short-circuiting.

The present invention is not limited to the above-described embodiments, and various changes and modifications can also be made thereto without departing from the features of the present invention. It is therefore intended that the foregoing detailed description be regarded as illustrative rather than limiting, and that it be understood that it is the following claims, including all equivalents, that are intended to define the spirit and scope of this invention.

What is claimed is:

1. A method of testing a connection between a speaker and a power amplifier which includes a booster power source which boosts a battery voltage, a power amplifier integrated circuit ("IC") which operates at a voltage boosted by the booster power source, and a connection terminal which connects the power amplifier IC with the speaker, and which determines that short-circuiting occurs on a ground side when a voltage of the connection terminal is lower upon comparison of a midpoint potential of an operation voltage of the power amplifier IC and a terminal voltage of the connection terminal, the method including:
    switching a voltage for a power amplifier IC from a booster power source to a battery voltage when a connection test of the speaker is conducted; and
    performing the determination using a midpoint potential of a battery voltage as the midpoint potential.

2. The method of claim 1, wherein a speaker connection test with respect to the power amplifier is conducted in a speaker connection testing processing unit provided in the power amplifier.

3. The method of claim 1, wherein a speaker connection test with respect to the power amplifier is conducted by a speaker connection testing device which is separate from the power amplifier.

4. The method of claim 1, wherein, when a speaker connection test with respect to the power amplifier is finished, a voltage for a power amplifier IC is switched from a battery voltage to a booster power source side.

5. The method claim 1, wherein the power amplifier further comprises a plurality of power amplifier ICs that match a plurality of speakers in number, and
    wherein, upon the speaker connection test, the power amplifier ICs are sequentially selected and tested.

6. The method of claim 1, wherein when a test result is outputted to an outside, the stored test result is read and outputted.

7. A speaker connection testing device for a power amplifier which includes a booster power source which boosts a battery voltage, a power amplifier IC which operates at a voltage boosted by the booster power source, and a connection terminal which connects the power amplifier IC with the speaker, and which comprises a speaker connection test processing unit which determines that short-circuiting occurs on a ground side when a voltage of the connection terminal is lower upon comparison of a midpoint potential of an operation voltage of the power amplifier IC and a terminal voltage of the connection terminal, wherein in the booster power source, a battery voltage pull-in unit configured to pull in a battery voltage is provided in parallel to a boosting unit which boosts a battery voltage, and a switching unit is provided that is configured to switch a supply voltage from a booster power source to a power amplifier IC, to the booster unit or to the battery voltage pull-in unit; and wherein upon a connection test of a speaker, the speaker connection test processing unit is configured to make the switching unit switch a voltage for a power amplifier IC to a battery voltage, and to perform the determination using a midpoint potential of a battery voltage as the midpoint potential.

8. The speaker connection testing device of claim 7, wherein the speaker connection test processing unit is provided in a power amplifier.

9. The speaker connection testing device of claim 7, wherein the speaker connection test processing unit is provided in a speaker connection testing device which is separate from a power amplifier.

10. The speaker connection testing device of claim 7, wherein, when a speaker connection test with respect to the power amplifier is finished, the switching unit is configured to switch a voltage for a power amplifier IC, from a battery voltage to a booster power source side.

11. The speaker connection testing device of claim 7, wherein a plurality of power amplifier ICs matching a plurality of speakers in number are provided and a test channel specifying unit provided in the speaker connection test processing unit is configured to sequentially select a power amplifier IC to conduct a speaker connection test.

12. The speaker connection testing device of claim 7, wherein the speaker connection test processing unit further comprises a test result storage unit configured to store a test result, wherein a test result outputting unit is configured to read the stored test result from the test result storage unit and to output the test result.

* * * * *